US010109336B1

(12) United States Patent
Frank et al.

(10) Patent No.: US 10,109,336 B1
(45) Date of Patent: Oct. 23, 2018

(54) DOMAIN WALL CONTROL IN FERROELECTRIC DEVICES

(71) Applicant: International Business Machines Corporation, Armonk, NY (US)

(72) Inventors: Martin M. Frank, Dobbs Ferry, NY (US); Jonathan Z. Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/807,617

(22) Filed: Nov. 9, 2017

(51) Int. Cl.
*G11C 11/22* (2006.01)
*H01L 27/11507* (2017.01)
*H01L 49/02* (2006.01)

(52) U.S. Cl.
CPC ........ *G11C 11/221* (2013.01); *G11C 11/2275* (2013.01); *H01L 27/11507* (2013.01); *H01L 28/60* (2013.01)

(58) Field of Classification Search
CPC ............... G11C 11/221; G11C 11/2275; H01L 27/11507; H01L 28/60
See application file for complete search history.

(56) References Cited

U.S. PATENT DOCUMENTS

| | | | |
|---|---|---|---|
| 3,862,795 A | 1/1975 | Tellerman | |
| 4,088,391 A | 5/1978 | Kumada | |
| 7,511,325 B2 * | 3/2009 | Koiwa | H01L 28/55 257/309 |
| 8,379,429 B2 | 2/2013 | Ishiwata | |
| 8,669,121 B2 | 3/2014 | Yamamoto | |
| 9,135,973 B2 | 9/2015 | Ohno | |
| 2011/0308580 A1 | 12/2011 | Seidel | |

(Continued)

OTHER PUBLICATIONS

Mikalensen et al., "Additive Deposition and Patterning of Ferroelectric Materials on Non-Planar Surfaces by Chemical-Solution Methods", Department of Materials Science and Engineering, and Frederick Seitz Materials Research Laboratory, Univeristy of Illinois at Urbana-Champaign, Urbana, IL, printed Jun. 14, 2017, 4 pages.

(Continued)

*Primary Examiner* — Ajay Ojha
(74) *Attorney, Agent, or Firm* — Edward J. Wixted, III

(57) ABSTRACT

A ferroelectric device includes a first electrode and a second electrode that each comprise one or more electrically conductive layers. The ferroelectric device also includes a layer of ferroelectric material disposed between, and in electrical communication with, the first electrode and the second electrode. In some embodiments, the first electrode and/or the second electrode include a stepped vertical protrusion that protrudes into the layer of ferroelectric material. In certain embodiments, the layer of ferroelectric material comprises a region of reduced lateral width. The region of reduced lateral width and/or the stepped vertical protrusion enables changing a polarity of a portion of the ferroelectric material that is proximate to those features, in response to a programming signal applied across the first and second electrodes, without changing a polarity of one or more other portions of the layer of ferroelectric material. A corresponding method is also disclosed herein.

20 Claims, 10 Drawing Sheets

(56) References Cited

U.S. PATENT DOCUMENTS

2014/0062530 A1    3/2014  Miao
2016/0225775 A1*   8/2016  Park ..................... H01L 29/516

OTHER PUBLICATIONS

Vasudevan et al., "Domain Wall Geometry Controls Conduction in Ferroelectrics", NANO Letters, pubs.asc.org/NanoLett, ACS Publications, © 2012 American Chemical Society, Published: Sep. 20, 2012, 8 pages.

Yamamoto et al., "Novel polarization reversal technique using liquid electrodes and LiNbO3 substrates with patterned grooves", © 2003 Optical Society of America, 3 pages.

* cited by examiner

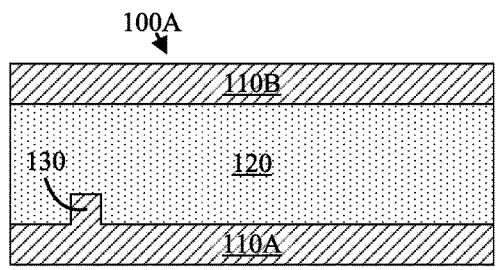
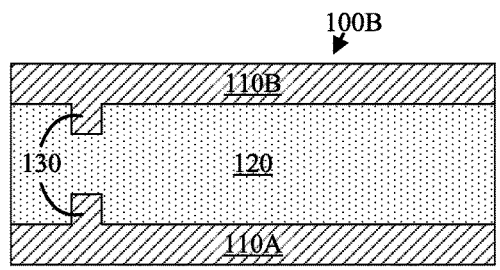
FIG. 1A  FIG. 1B
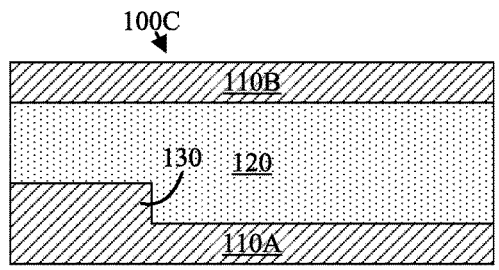
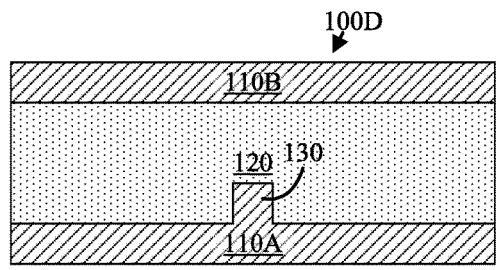
FIG. 1C  FIG. 1D
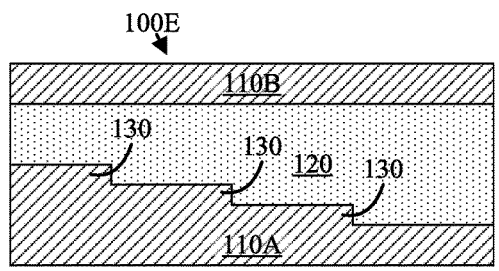
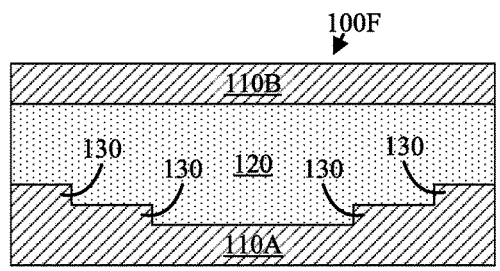
FIG. 1E  FIG. 1F
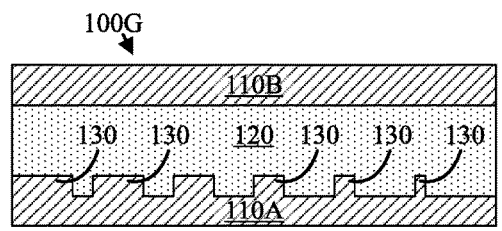
FIG. 1G

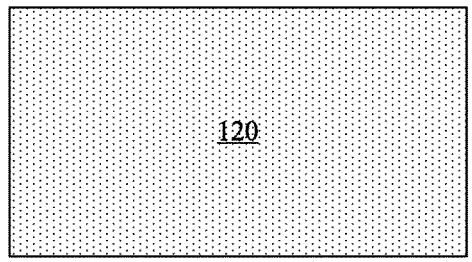
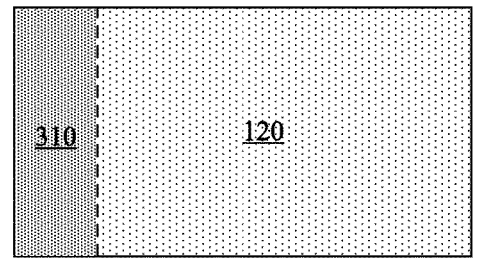
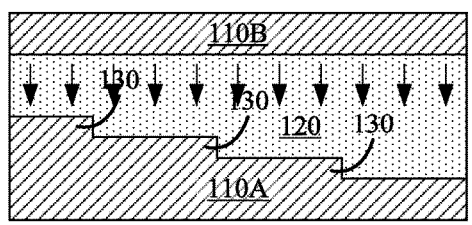
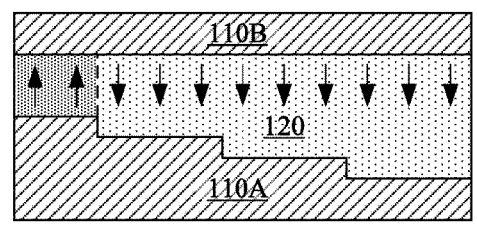
FIG. 3A          FIG. 3B
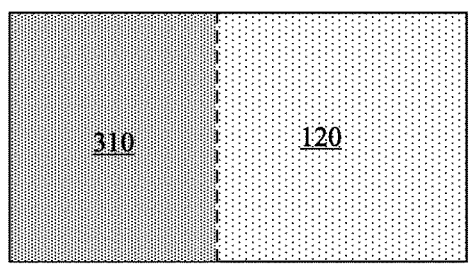
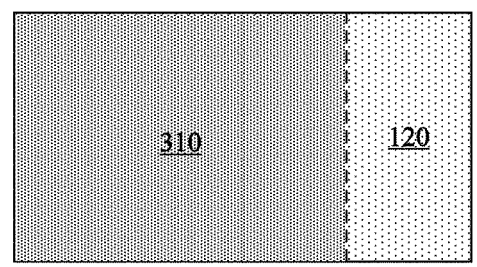
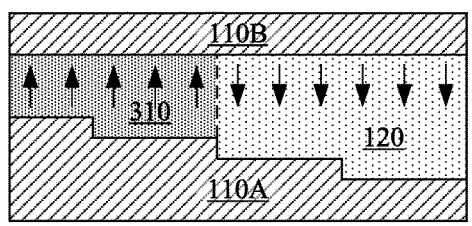
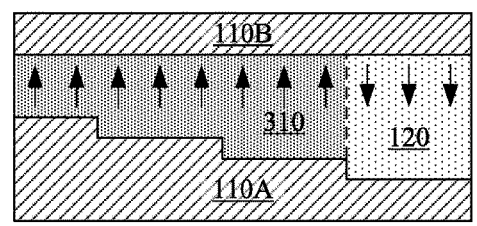
FIG. 3C          FIG. 3D

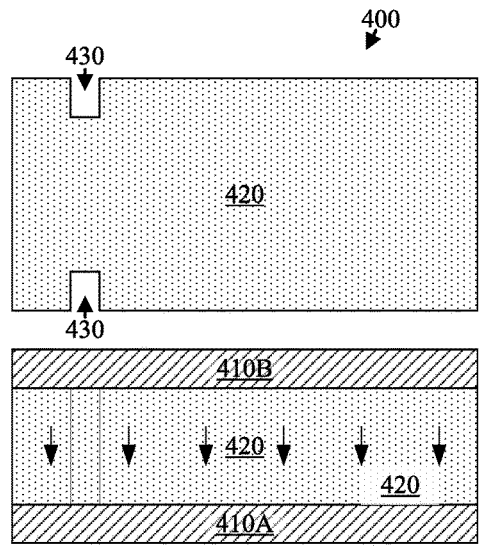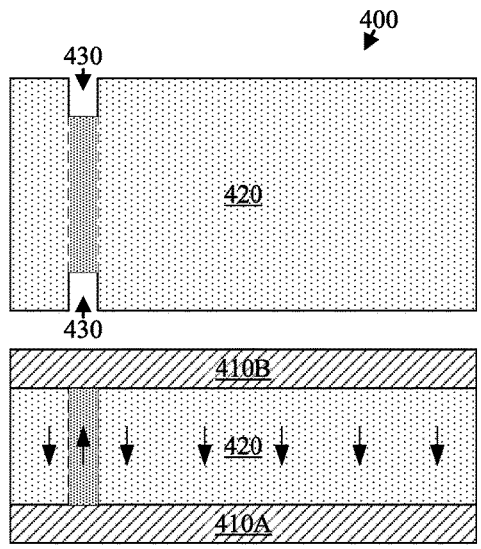
FIG. 4A  FIG. 4B
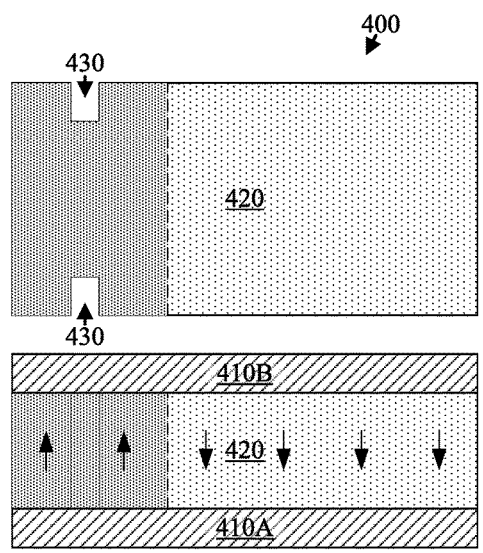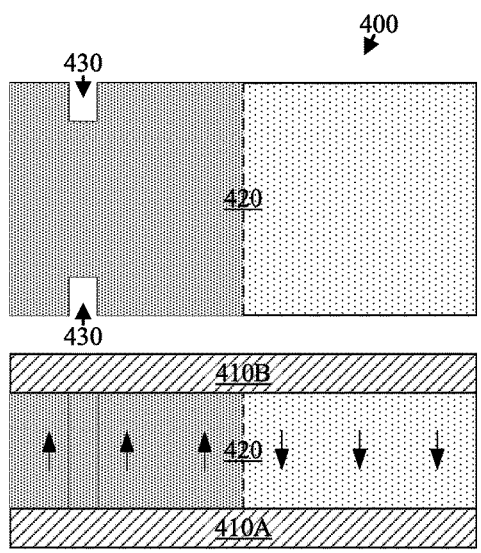
FIG. 4C  FIG. 4D

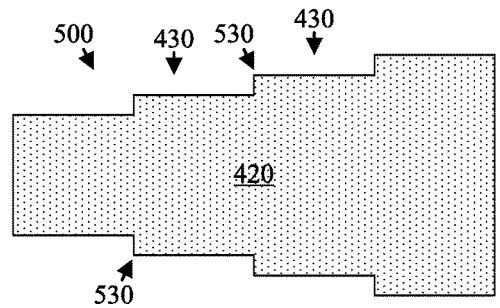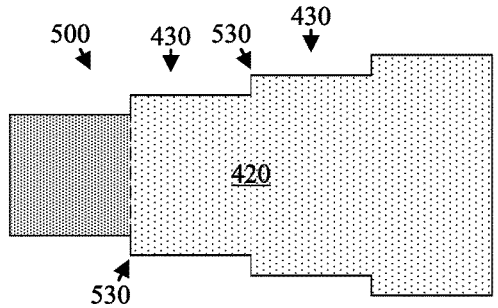
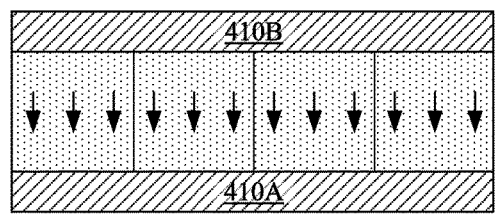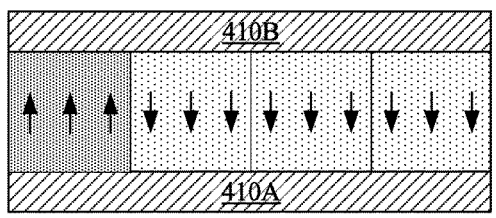
FIG. 5A　　　　　　　　　　FIG. 5B
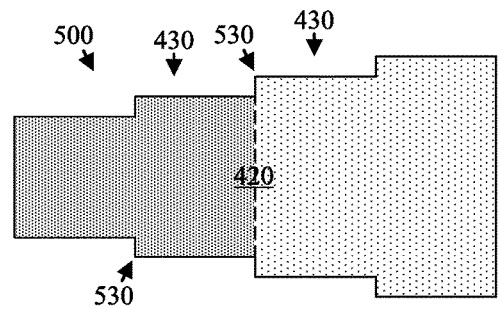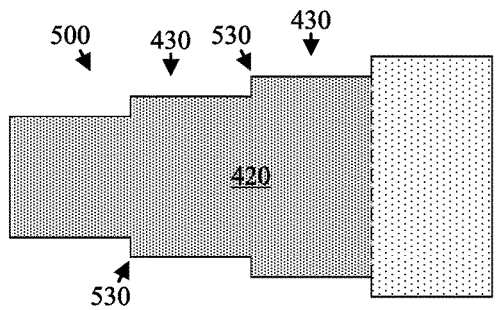
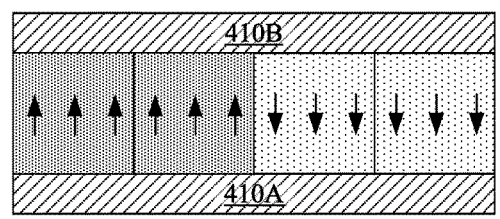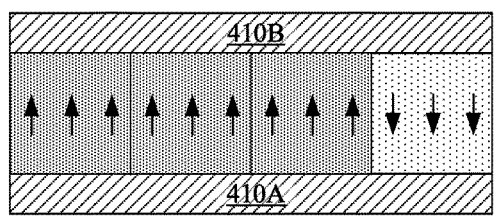
FIG. 5C　　　　　　　　　　FIG. 5D

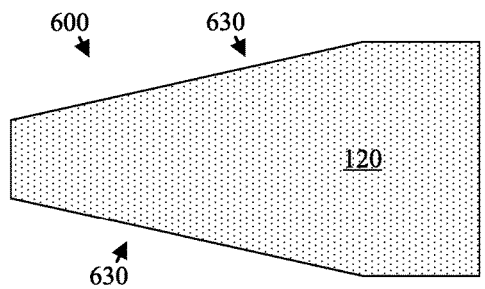
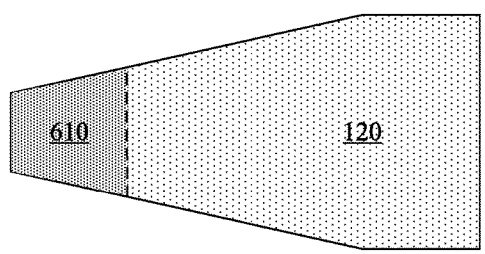
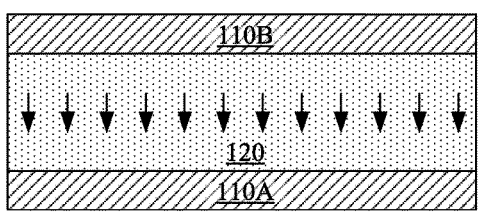
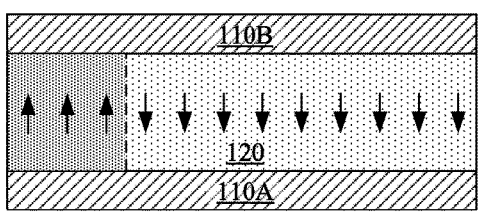
FIG. 6A
FIG. 6B
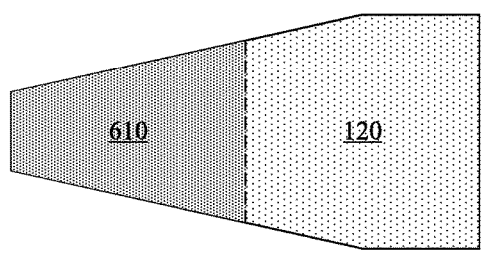
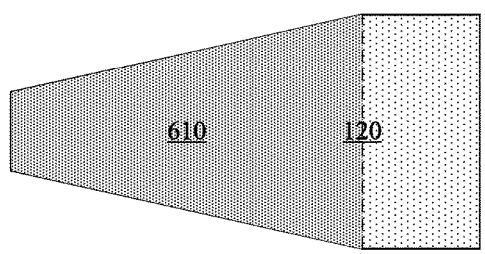
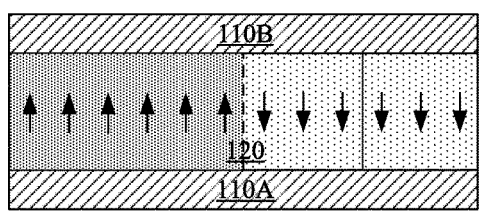
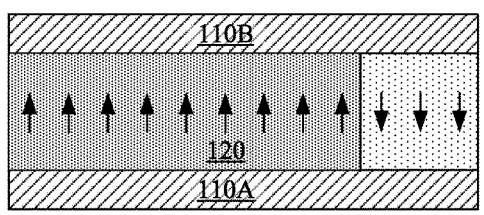
FIG. 6C
FIG. 6D

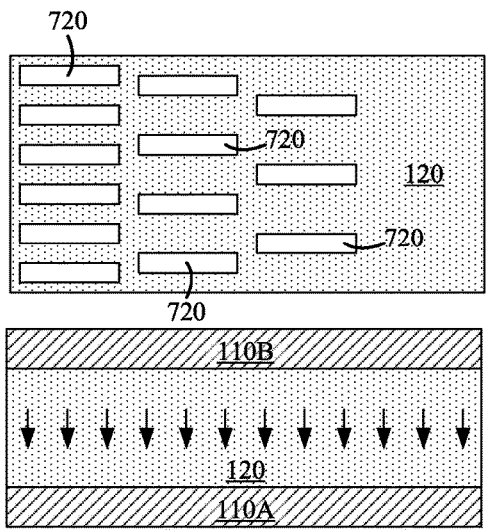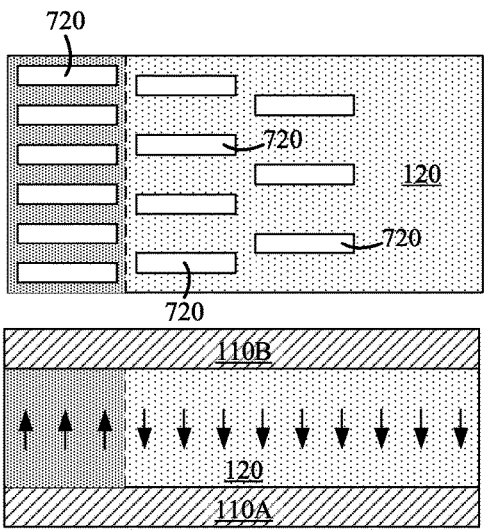
FIG. 7A  FIG. 7B
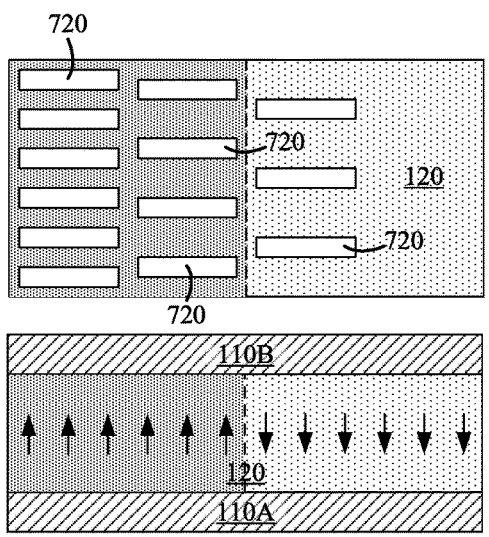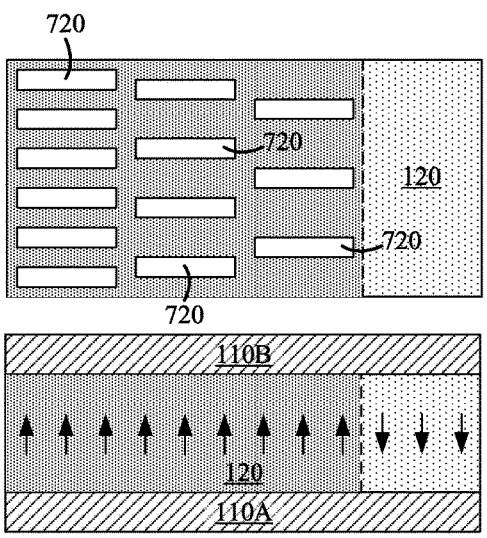
FIG. 7C  FIG. 7D

DOMAIN WALL CONTROL IN FERROELECTRIC DEVICES

BACKGROUND OF THE INVENTION

The present invention relates generally to ferroelectric devices and more particularly to structures and methods for controlling the location of domain walls in ferroelectric devices.

Ferroelectric (FE) materials are sometimes used in digital memory devices. For example, commercially available FeRAM devices store a single bit of information by discriminating between 'up' and 'down' polarizations of the FE layer in a metal-FE-metal stack. For analog applications, such as synaptic devices for neuromorphic computing, and for discreet multi-bit storage applications, it would be desirable to control and detect more than two polarization states of the FE layer.

SUMMARY

A ferroelectric device includes a first electrode and a second electrode that each comprise one or more electrically conductive layers. The ferroelectric device also includes a layer of ferroelectric material disposed between, and in electrical communication with, the first electrode and the second electrode. In some embodiments, the first electrode and/or the second electrode include a vertical protrusion that protrudes into the layer of ferroelectric material. The vertical protrusion may comprise one or more steps. In certain embodiments, the layer of ferroelectric material comprises a region of reduced lateral width. The region of reduced lateral width and/or the vertical protrusion enables changing a polarity of a portion of the ferroelectric material that is proximate to those features, in response to a programming signal applied across the first and second electrodes, without changing a polarity of one or more other portions of the layer of ferroelectric material. A corresponding method is also disclosed herein.

BRIEF DESCRIPTION OF THE DRAWINGS

FIGS. 1A-1G are cross-sectional side view illustrations depicting various examples of a ferroelectric device that are each in accordance with at least one embodiment of the present invention;

FIGS. 3A-3D are cross-sectional side and top view illustrations depicting the effect of various programming signals on the domain walls of one example of a ferroelectric device in accordance with at least one embodiment of the present invention;

FIGS. 4A-4D are cross-sectional side and top view illustrations depicting the effect of various programming signals on the domain walls of one example of a ferroelectric device in accordance with at least one embodiment of the present invention;

FIGS. 5A-5D are cross-sectional side and top view illustrations depicting the effect of various programming signals on the domain walls of one example of a ferroelectric device in accordance with at least one embodiment of the present invention;

FIGS. 6A-6D are cross-sectional side and top view illustrations depicting the effect of various programming signals on the domain walls of one example of a ferroelectric device in accordance with at least one embodiment of the present invention;

FIGS. 7A-7D are cross-sectional side and top view illustrations depicting the effect of various programming signals on the domain walls of one example of a ferroelectric device in accordance with at least one embodiment of the present invention;

DETAILED DESCRIPTION

Figures 2A, 2B:
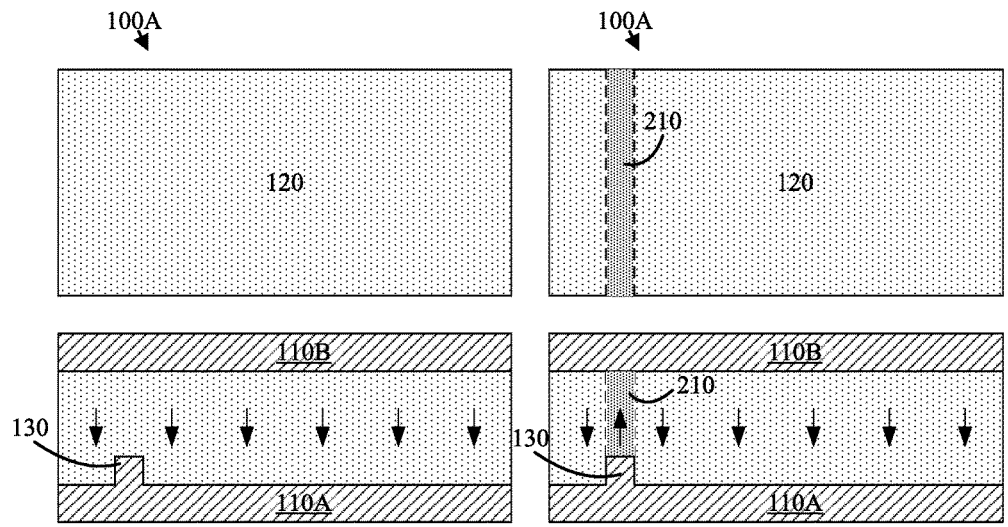
FIGS. 2A-2D are cross-sectional side and top view illustrations depicting the effect of various programming signals on the domain walls of one example of a ferroelectric device in accordance with at least one embodiment of the present invention.

At least some of the embodiments disclosed herein recognize that the voltage or energy required to reverse the polarization of a portion of a ferroelectric device may be dependent on the distance between the electrodes and the volume of the ferroelectric material that is reversed.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention. These features and advantages will become more fully apparent from the following drawings, description and appended claims, or may be learned by the practice of the invention as set forth hereinafter.

FIGS. 1A-1G are cross-sectional illustrations depicting various examples of a ferroelectric device 100 (i.e., 100A-100G) that are each in accordance with at least one embodiment of the present invention. As depicted, each ferroelectric device 100 includes electrodes 110 (i.e., a lower electrode 110A and an upper electrode 110B), a ferroelectric layer 120, and one or more protrusions 130. The electrodes 110 may comprise one or more electrically conductive layers that facilitate applying a programming signal to the ferroelectric layer 120 and polarizing the ferroelectric layer 120. See FIG. 8 and the associated description for information on a polarization programming method that may be used to polarize the ferroelectric devices 100 and the like.

The depicted ferroelectric layer 120 is disposed between, immediately adjacent to, and in electrical communication with each of the electrodes 110. The depicted protrusions 130 are stepped vertical protrusions that protrude into the layer of ferroelectric material and form one or more plateaus and corresponding regions of reduced thickness for the ferroelectric layer 120. Using stepped vertical protrusions to form one or more regions of reduced thickness may enable formation of (flipping of) localized polarization domains (i.e., are proximate to the stepped protrusions) that have a polarity that is opposite to one or more surrounding polarization domains.

In contrast to peaked protrusions, the polarization domains produced by plateaued protrusions may have a volume that is sufficient to resist unwanted polarization reversal of the localized polarization domains e.g., in the absence of an applied programming signal to the electrodes 110. Furthermore, the stepped protrusions may be easier to form (e.g., via lithography or the like). One of skill in the art will appreciate that the walls of the stepped protrusions need not be completely vertical but may have some slope or curvature associated with a particular manufacturing process.

The layer of ferroelectric material may have a substantially uniform thickness outside of the stepped vertical protrusion(s) and may be substantially planar outside of the stepped vertical protrusion(s). The region of reduced thickness may or may not extend across a lateral dimension (e.g., across a depth dimension that is orthogonal to the page in the depicted examples). In some embodiments, at least one of the stepped protrusions is proximate to one end of the ferroelectric device. Proximity to one end of the ferroelectric device enables formation of a single domain wall interface as will be shown in subsequent Figures.

FIGS. 2A-2D are cross-sectional side and top view illustrations depicting the effect of various programming signals on the domain walls of one example of a ferroelectric device in accordance with at least one embodiment of the present invention. The depicted example corresponds to the ferroelectric device 100A depicted in FIG. 1A.

One of skill in the art will appreciate that, in some embodiments, the velocity of travel of a domain wall may correspond to the voltage of the programming signal and the volume of the resulting domain may correspond to the voltage and duration (i.e., total energy) of the programming signal. In other embodiments, the ferroelectric device is configured and/or programmed so that the location of the domain wall corresponds to the voltage of the programming signal (although a minimum duration or a fixed duration at that voltage may be required). Consequently, the programming of ferroelectric devices may be energy-based or voltage-based. Combinations thereof are also possible.

As shown in FIG. 2A, the ferroelectric device 100A (or the like) may be initialized with an initialization signal that may be of sufficient voltage or energy to align all of the polarization domains of the ferroelectric layer 120 to one particular direction orthogonal to the electrodes 110 as a whole. In the depicted example, the initialization signal aligns all of the polarization domains in a substantially downward direction.

As shown in FIG. 2B, a minimum volume flipping signal may be applied to the electrodes 110 that flips the polarity of polarization domains of the ferroelectric layer 120 that are proximate to the protrusions 130 to produce a flipped polarization region 210. The location of the flipped polarization region 210 may be determined by the placement of the protrusion(s) 130. The polarity of the minimum volume flipping signal may be opposite of that of the initialization signal. The size of the protrusion 130 and the volume of the flipped polarization region 210 may be sufficient to (statistically) prevent unintended reversals of the flipped polarization domains within region 210 due to thermal effects, ambient electromagnetic fields and the like.

Figures 2C, 2D:
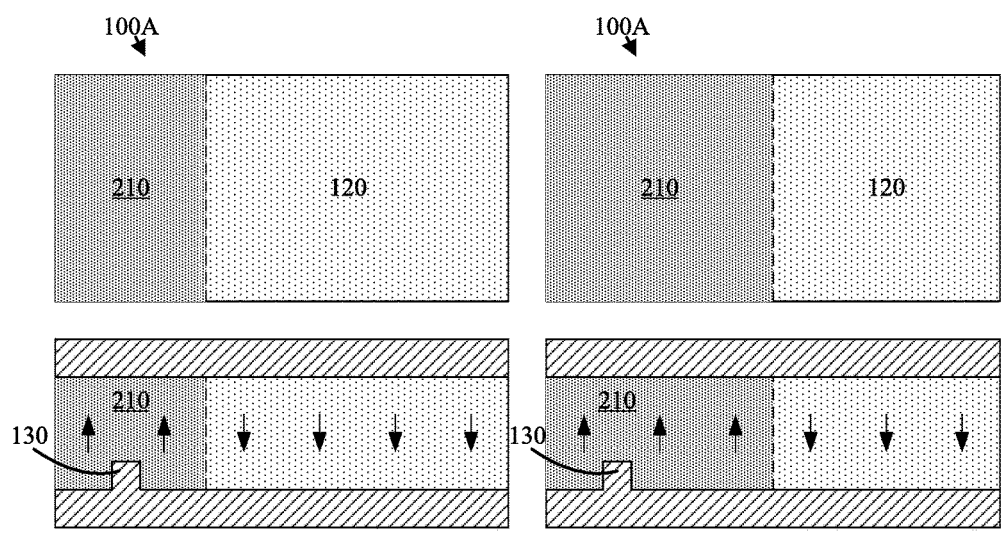

As shown in FIGS. 2C and 2D, one or more programming signals may be applied to the electrodes 110 that increase the volume of the flipped polarization region 210. The volume of the flipped polarization region 210 may correspond to the voltage or total energy of the programming signal applied to the electrodes 110. As the magnitude, and in some embodiments, the duration of the programming signal is increased, the volume of the flipped polarization region may increase until the flipped polarization region 210 consumes the entire ferroelectric layer 120. The voltage or energy required to flip the entire flipped polarization region 210 may be substantially identical to the voltage or energy used to initialize the polarity of the entire ferroelectric layer 120. However, the polarity of the programming signal may be opposite that of the initialization signal.

FIGS. 3A-3D are cross-sectional side and top view illustrations depicting the effect of various programming signals on the domain walls of one example of a ferroelectric device in accordance with at least one embodiment of the present invention. The depicted example corresponds to the ferroelectric device 100E depicted in FIG. 1E.

As shown in FIG. 3A, the ferroelectric device 100E (or the like) may be initialized via an initialization signal in order to align all of the polarization domains of the ferroelectric layer 120 in a selected direction (e.g., up or down) that is orthogonal to the electrodes 110. Similar to the example shown in FIGS. 2A-2D, a programming signal may be applied to the electrodes 110 that flips the polarity of polarization domains of the ferroelectric layer 120 that are proximate to the protrusions 130 to produce a flipped polarization region 310 such as those shown in FIGS. 3B-3D. Also, one or more programming signals may be subsequently applied to the electrodes 110 that each increase or decrease the volume of the flipped polarization region 310.

In contrast to some ferroelectric devices 100, the ferroelectric device 100E (or the like) may have multiple stepped protrusions 130. The use of multiple stepped protrusions may encourage discretization of the volume of the flipped polarization region 310. The voltage or energy of the programming signal applied to the electrodes 110 to produce a particular discrete volume for the flipped polarization 310 may be selected to match the change in volume between two particular discrete volumes.

FIGS. 4A-4D are cross-sectional side and top view illustrations depicting the effect of various programming signals on the domain walls of one example of a ferroelectric device 400 in accordance with at least one embodiment of the present invention. As depicted, the ferroelectric device 400 includes electrodes 410 (i.e., a lower electrode 410A and an upper electrode 410B) and a ferroelectric layer 420.

Instead of using protrusions from the electrodes that result in a region of reduced thickness, the depicted ferroelectric device 400 includes at least one region of reduced lateral width for the ferroelectric layer 420. For example, the region of reduced lateral width may be achieved via one or more lateral indentations 430 of the ferroelectric device 400 as a whole and/or the ferroelectric layer 420 itself. In the depicted embodiment, the indentations are stepped indentations.

Each region of reduced lateral width may provide less resistance to polarization changes and enable changing the polarity of the corresponding portion of the ferroelectric material more readily than other regions. The change in polarity may occur in response to a programming signal applied across the electrodes 410. The change in polarity may occur without changing the polarity of one or more other portions (e.g., the remainder) of the ferroelectric layer 420.

FIGS. 5A-5D are cross-sectional side and top view illustrations depicting the effect of various programming signals on the domain walls of one example of a ferroelectric device 500 in accordance with at least one embodiment of the present invention. In response to one or more programming signals, the ferroelectric device 500 includes a flipped polarization region 510.

The depicted embodiment includes a stepped lateral profile 530 that encourages discretization of the volume of the flipped polarization region 510. The boundaries of the flipped polarization region 510 may tend to align with the edges of the steps in the stepped lateral profile 530. The energy of the programming signal applied to the electrodes 110 may be selected to match the change in volume between two particular discrete volumes corresponding to two particular steps in the stepped lateral profile 530.

FIGS. 6A-6D are cross-sectional side and top view illustrations depicting the effect of various programming signals on the domain walls of one example of a ferroelectric device 600 in accordance with at least one embodiment of the present invention. In response to one or more programming signals, the ferroelectric device 600 includes a flipped polarization region 610. The depicted embodiment includes a tapered profile that enables better control over the volume of the flipped polarization region and the signal-to-noise ratio of the residual voltage provided by the ferroelectric device 600. As the volume of the flipped polarization region 610 increases, the volume of the ferroelectric layer 120 that is immediately adjacent to region 610 also increases. As a result, a greater amount of energy is needed to advance the domain wall a selected distance. Consequently, the signal-to-noise ratio of the polarization states may be controlled be substantially constant as the flipped polarization region 610 increases in size.

FIGS. 7A-7D are cross-sectional side and top view illustrations depicting the effect of various programming signals on the domain walls of one example of a ferroelectric device 700 in accordance with at least one embodiment of the present invention. As depicted, the ferroelectric device 700 includes upper and lower electrodes 110 disposed above and below a ferroelectric layer 120. The ferroelectric device 700 also includes a number of apertures 710.

The apertures 710 provide voids within the ferroelectric layer 120 and optionally one, or both, of the electrodes 110. The voids may be positioned within the ferroelectric layer 120 such that the ferroelectric density of the device varies as a function of position. In the depicted embodiment, the ferroelectric density varies according to horizontal position and increases from left to right.

In a polycrystalline FE film, the crystalline orientation of each individual grain defines preferred polarization directions. However, in a parallel-plate capacitor device, the electrical field will be essentially normal to the two plates. Therefore, two otherwise identical grains with different orientation of their preferred polarization direction will tend to switch FE state at different voltages. A polycrystalline film with a distribution of grain orientations may therefore exhibit a distribution of switching voltages (fields), which could increase the complexity of the programming signals.

To simplify the programming signals so that they are more consistent and potentially voltage-based, a highly textured FE film is preferred. This could be achieved, e.g., by deposition onto a suitable, highly textured bottom electrode. For perovskite FE materials, bottom electrodes such as Pt(111) and Ir(111) have been described in the literature. In general, other well-oriented bottom electrodes, using materials such as TiN, are contemplated as well.

Figure 8:
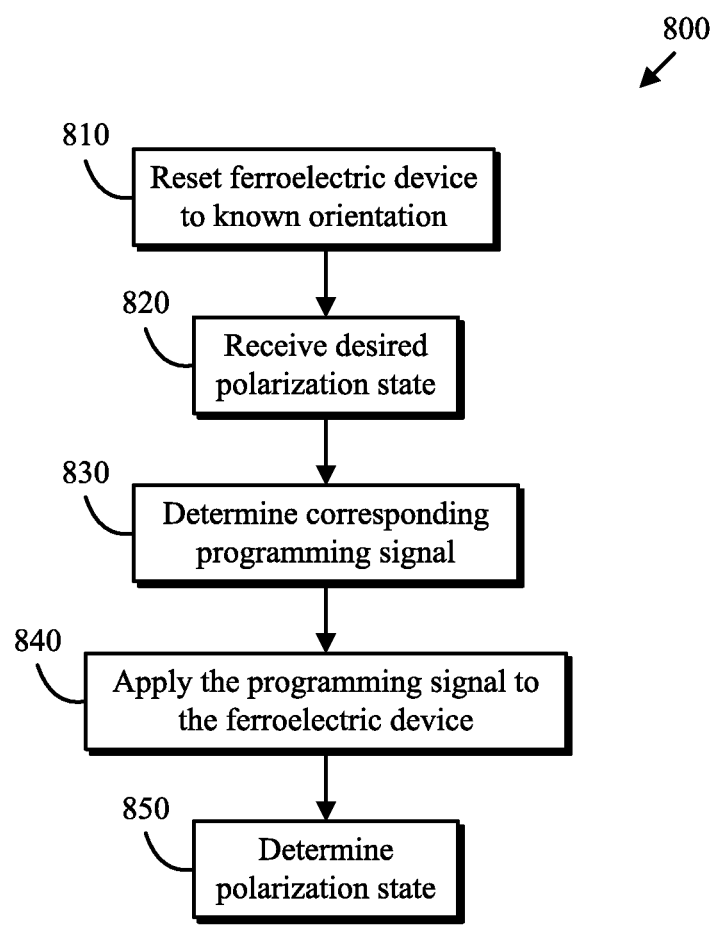
FIG. 8 is a flowchart depicting one example of a polarization programming method in accordance with at least one embodiment of the present invention.
Figure 9A:
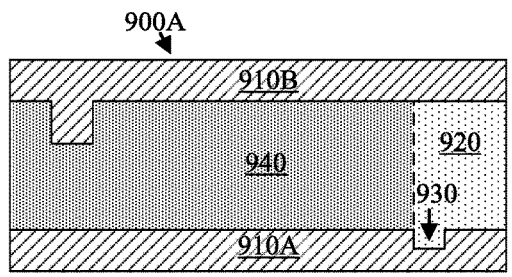
FIGS. 9A-9E are cross-sectional side view illustrations depicting various examples of a ferroelectric device that are each in accordance with at least one embodiment of the present invention.
Figure 9B:
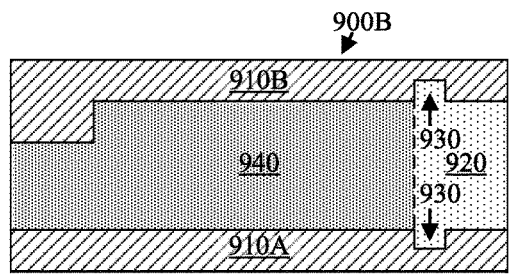
Figure 9C:
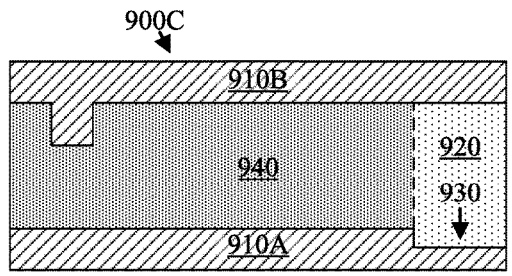
Figure 9D:
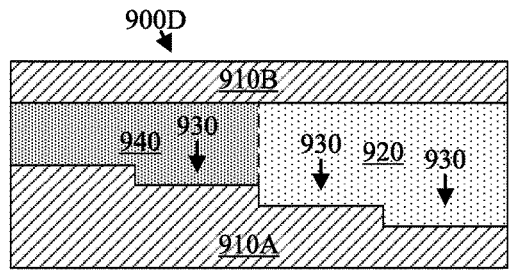
Figure 9E:
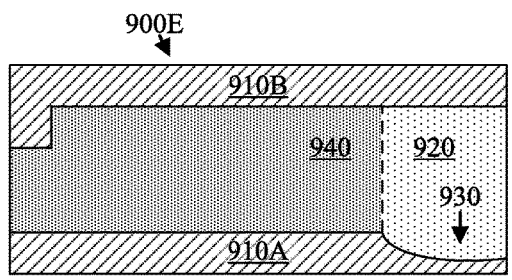

FIG. 8 is a flowchart depicting one example of a polarization programming method 800 in accordance with at least one embodiment of the present invention. As depicted, the polarization programming method 800 includes resetting (810) a polarization device, receiving (820) a desired polarization state, determining (830) a corresponding programming signal and applying (840) the programming signal to the polarization device. The polarization programming method 800 may be conducted with various ferroelectric devices disclosed herein including the various versions of the ferroelectric device 100.

Resetting (810) a polarization device may include applying a reset signal to the electrodes 110, or the like, that is (statistically) guaranteed to orient (i.e., polarize) all of the ferroelectric material of the ferroelectric device to a known orientation. Receiving (820) a desired polarization state may include receiving information indicating the desired polarization state. The information may indicate the portion of the ferroelectric material that is to be flipped to polarization that is opposite that of the initial polarization.

Determining (830) a corresponding programming signal may include calculating the incremental or total volume of ferroelectric material that must be flipped. The incremental or total volume may indicate the magnitude and duration of the programming signal. Applying (840) the programming signal to the polarization device may include applying the signal across the electrodes 110.

FIGS. 9A-9E are cross-sectional illustrations depicting various examples of a ferroelectric device 900 (i.e., 900A-900E) that are each in accordance with at least one embodiment of the present invention. As depicted, each ferroelectric device 900 includes electrodes 910 (i.e., a lower electrode 910A and an upper electrode 910B), a ferroelectric layer 920, and one or more recessed regions 930 within the electrodes 910. The recessed regions 930 result in a corresponding region of increased thickness for the ferroelectric layer 920. The programming method depicted in FIG. 8 may be used to polarize the ferroelectric devices 900 and the like.

The electrodes 910 may comprise one or more electrically conductive layers that facilitate applying a programming signal to the ferroelectric layer 920 and polarizing the ferroelectric layer 920. The depicted ferroelectric layer 920 is disposed between, immediately adjacent to, and in electrical communication with each of the electrodes 910. The recessed regions 930 and corresponding areas of increased thickness may provide a stopping or resistance region for domain growth that enables limiting the growth of, and reducing the size of, a flipped polarization domain 940. In some embodiments, a recessed region 930 and corresponding region of increased thickness is proximate to one end of the layer of ferroelectric material in order to prevent the flipped polarization domain 940 from consuming that end of the ferroelectric device.

Many of the depicted recessed regions 930 are stepped recesses that protrude into at least one of the electrodes 910 and form one or more plateaus and corresponding regions of increase thickness for the ferroelectric layer 920. Using stepped recesses to form one or more regions of increase thickness may encourage formation of polarization domains of a selected volume. One of skill in the art will appreciate that the walls of the recessed regions need not be completely vertical but may have some slope or curvature associated with a particular manufacturing process.

The layer of ferroelectric material 920 may be substantially planar outside of the region(s) of increased thickness and have a substantially uniform thickness outside of the region(s) of increased thickness. The region of increased thickness may, or may not, extend across an entire lateral dimension of the layer of ferroelectric material (e.g., along a depth dimension that is orthogonal to the page in the depicted examples). Consequently, the region of increased thickness could be an island within a surrounding region of decreased thickness, could separate two regions of decreased thickness, or could reside at one end of the ferroelectric device 900.

Figure 10:
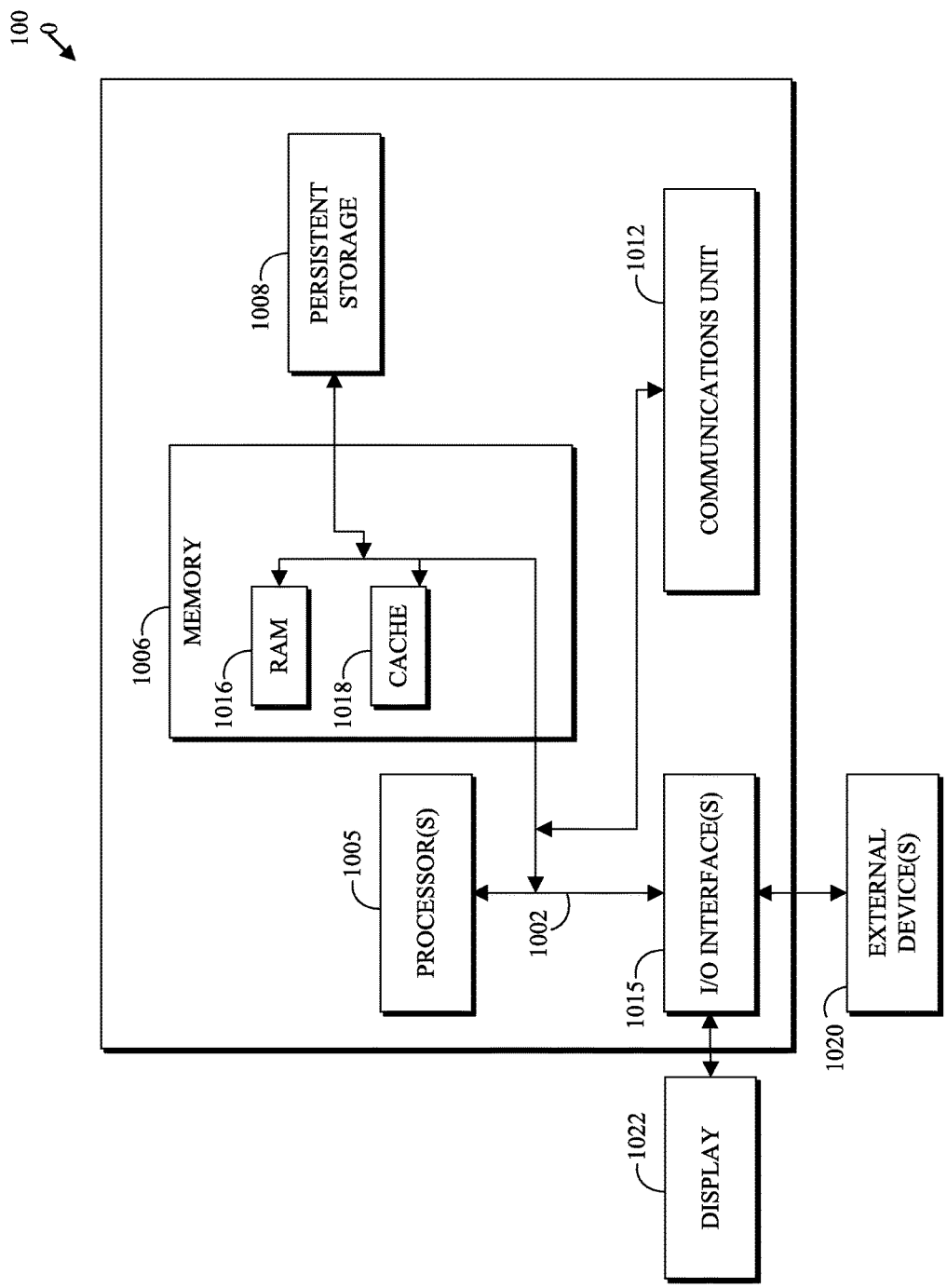
FIG. 10 is a block diagram depicting one example of a computing apparatus suitable for executing one or more of the methods disclosed herein.

FIG. 10 is a block diagram depicting one example of a computing apparatus (i.e., computer 1000) suitable for executing one or more of the methods disclosed herein. For example, the computer 1000 may be used to program one or more ferroelectric devices 100. It should be appreciated that FIG. 10 provides only an illustration of one embodiment and does not imply any limitations with regard to the environments in which different embodiments may be implemented. Many modifications to the depicted environment may be made.

As depicted, the computer 1000 includes communications fabric 1002, which provides communications between computer processor(s) 1005, memory 1006, persistent storage 1008, communications unit 1012, and input/output (I/O) interface(s) 1015. Communications fabric 1002 can be implemented with any architecture designed for passing data and/or control information between processors (such as microprocessors, communications and network processors, etc.), system memory, peripheral devices, and any other hardware components within a system. For example, communications fabric 1002 can be implemented with one or more buses.

Memory 1006 and persistent storage 1008 are computer readable storage media. In the depicted embodiment, memory 1006 includes random access memory (RAM) 1016 and cache memory 1018. In general, memory 1006 can include any suitable volatile or non-volatile computer readable storage media.

One or more programs may be stored in persistent storage 1008 for execution by one or more of the respective computer processors 1005 via one or more memories of memory 1006. The persistent storage 1008 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 1008 may also be removable. For example, a removable hard drive may be used for persistent storage 1008. Other examples include optical and magnetic disks, thumb drives, and smart cards that are inserted into a drive for transfer onto another computer readable storage medium that is also part of persistent storage 1008.

Communications unit 1012, in these examples, provides for communications with other data processing systems or devices. In these examples, communications unit 1012 includes one or more network interface cards. Communications unit 1012 may provide communications through the use of either or both physical and wireless communications links.

I/O interface(s) 1015 allows for input and output of data with other devices that may be connected to computer 1000. For example, I/O interface 1015 may provide a connection to external devices 1020 such as a keyboard, keypad, a touch screen, and/or some other suitable input device. External devices 1020 can also include portable computer readable storage media such as, for example, thumb drives, portable optical or magnetic disks, and memory cards.

Software and data used to practice embodiments of the present invention can be stored on such portable computer readable storage media and can be loaded onto persistent storage 1008 via I/O interface(s) 1015. I/O interface(s) 1015 may also connect to a display 1022. Display 1022 provides a mechanism to display data to a user and may be, for example, a computer monitor.

One of skill in the art will appreciate that the above disclosed embodiments may be adapted for a variety of environments and applications. Furthermore, the programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The embodiments disclosed herein include a system, a method, and/or a computer program product. The computer program product may include a computer readable storage medium (or media) having computer readable program instructions thereon for causing a processor to carry out the methods disclosed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A ferroelectric device comprising:
   a first electrode comprising one or more electrically conductive layers;
   a second electrode comprising one or more electrically conductive layers;
   a layer of ferroelectric material disposed between, and in electrical communication with, the first electrode and the second electrode;
   wherein at least one of the first electrode and the second electrode comprises a stepped vertical protrusion that protrudes into the layer of ferroelectric material; and
   wherein the stepped vertical protrusion enables changing a polarity of a portion of the layer of ferroelectric material that is proximate to the stepped vertical protrusion, in response to a programming signal applied across the first and second electrodes, without changing a polarity of one or more other portions of the layer of ferroelectric material.

2. The ferroelectric device of claim 1, wherein the stepped vertical protrusion is proximate to a first end of the layer of ferroelectric material.

3. The ferroelectric device of claim 1, wherein a single domain wall is formed in the layer of ferroelectric material in response to the programming signal applied to the first and second electrodes.

4. The ferroelectric device of claim 1, wherein the stepped vertical protrusion comprises multiple steps.

5. The ferroelectric device of claim 1, wherein the layer of ferroelectric material has a substantially uniform thickness outside of the stepped vertical protrusion.

6. The ferroelectric device of claim 1, wherein the layer of ferroelectric material is substantially planar outside of the stepped vertical protrusion.

7. The ferroelectric device of claim 1, wherein the stepped vertical protrusion extends across a lateral dimension of the layer of ferroelectric material.

8. The ferroelectric device of claim 1, wherein the stepped vertical protrusion does not extend across either lateral dimension of the layer of ferroelectric material.

9. The ferroelectric device of claim 1, wherein the first electrode and the second electrode each comprise the stepped vertical protrusion.

10. A method for storing data, the method comprising:
providing a ferroelectric device comprising:
a first electrode comprising one or more electrically conductive layers,
a second electrode comprising one or more electrically conductive layers,
a layer of ferroelectric material disposed between, and in electrical communication with, the first electrode and the second electrode, and
wherein at least one of the first electrode and the second electrode comprises a stepped vertical protrusion that protrudes into the layer of ferroelectric material;
applying a programming signal across the first and second electrodes; and
wherein the stepped vertical protrusion enables changing a polarity of a portion of the ferroelectric material that is proximate to the stepped vertical protrusion, in response to applying the programming signal across the first and second electrodes, without changing a polarity of a remaining portion of the ferroelectric material.

11. The method of claim 10, further comprising applying an initialization signal across the first and second electrodes.

12. The method of claim 10, wherein the stepped vertical protrusion is proximate to a first end of the layer of ferroelectric material.

13. The method of claim 10, wherein a single domain wall is formed in the layer of ferroelectric material in response to the programming signal applied across the first and second electrodes.

14. The method of claim 10, wherein the stepped vertical protrusion comprises multiple steps.

15. The method of claim 10, wherein the layer of ferroelectric material has a substantially uniform thickness outside of the stepped vertical protrusion.

16. The method of claim 10, wherein the layer of ferroelectric material is substantially planar outside of the stepped vertical protrusion.

17. The method of claim 10, wherein the stepped vertical protrusion extends across a lateral dimension of the layer of ferroelectric material.

18. The method of claim 10, wherein the stepped vertical protrusion does not extend across either lateral dimension of the layer of ferroelectric material.

19. The method of claim 10, further comprising reading a residual voltage between the first electrode and the second electrode.

20. A ferroelectric device comprising:
a first electrode comprising one or more electrically conductive layers;
a second electrode comprising one or more electrically conductive layers;
a layer of ferroelectric material disposed between, and in electrical communication with, the first electrode and the second electrode;
wherein the layer of ferroelectric material comprises a region of reduced lateral width; and
wherein the region of reduced lateral width enables changing a polarity of a portion of the ferroelectric material that is proximate to the region of reduced lateral width, in response to a programming signal applied across the first and second electrodes, without changing a polarity of one or more other portions of the layer of ferroelectric material.

* * * * *